United States Patent [19]
Astier

[11] Patent Number: 5,936,835
[45] Date of Patent: Aug. 10, 1999

[54] ARRANGEMENT FOR SECURING A USER-INSTALLABLE UNIT INSIDE A COMPUTER HOUSING

[75] Inventor: Christian Astier, Grenoble, France

[73] Assignee: Hewlett-Packard Company, Palo Alto, Calif.

[21] Appl. No.: 08/925,421

[22] Filed: Sep. 8, 1997

[30] Foreign Application Priority Data

Sep. 19, 1996 [EP] European Pat. Off. .............. 96410096

[51] Int. Cl.⁶ .................................................... H05K 7/16
[52] U.S. Cl. ........................................................... 361/683
[58] Field of Search ..................................... 361/684, 683;
174/67; 439/345, 350, 327, 806, 61; 312/223.1,
223.2, 265.6, 223.6

[56] References Cited

U.S. PATENT DOCUMENTS

| | | |
|---|---|---|
| 4,873,395 | 10/1989 | Mast . |
| 4,971,563 | 11/1990 | Wells ........................................ 439/61 |
| 5,317,483 | 5/1994 | Swindler . |
| 5,493,479 | 2/1996 | Takahashi ................................ 361/814 |
| 5,601,349 | 2/1997 | Holt ...................................... 312/265.6 |
| 5,694,291 | 12/1997 | Feightner ................................ 361/683 |
| 5,751,545 | 5/1998 | Jung ...................................... 361/683 |

FOREIGN PATENT DOCUMENTS

| | | |
|---|---|---|
| 0637198A1 | 1/1995 | European Pat. Off. . |
| 0666524A2 | 9/1995 | European Pat. Off. . |

*Primary Examiner*—Leo P. Picard
*Assistant Examiner*—Jagdish Patel

[57] ABSTRACT

To facilitate user installation of units in a computer, a clamping lever arrangement is provided which can be tightened by an external screw to clamp in position one or more units internal to the housing. In one arrangement, the clamping lever is provided with four fingers that pass through respective apertures in the computer housing. Each finger serves to clamp in position a respective expansion card, or blanking plate if no card is present. Thus a single clamping lever with a single external fixing screw replaces the standard usage of a respective fixing screw for each card.

10 Claims, 5 Drawing Sheets

ARRANGEMENT FOR SECURING A USER-INSTALLABLE UNIT INSIDE A COMPUTER HOUSING

FIELD OF THE INVENTION

The present invention relates to an arrangement for securing a user-installable unit (such as a plug-in expansion card or disc drive unit) inside a computer housing.

BACKGROUND OF THE INVENTION

FIG. 1 of the accompanying drawings illustrates a standard plug-in expansion card 10 for a computer. The card 10 carries electronic circuitry (not shown) intended to connect with the main computer circuitry through a plug-in edge connector portion 11. Plugging in the card 10 by its connector portion 11 into a connector of the computer serves to locate the card in the computer. However, to retain the card in position and hold it fast, the card is further provided at one end with a metal mounting plate 12. This plate has locating tab 13 at one end and a screw-receiving recess 14 at the other end. The plate may be apertured to enable external access to external connectors mounted on the expansion card.

FIG. 2 shows a typical computer housing structure 15 in the region of mounting of expansion cards inside the computer. In particular, a metal mounting bridge 16 is provided which is adapted to support up to four expansion cards. The mounting bridge 16 is provided with four threaded apertures 17 for receiving fixing screws, one for each expansion card to be secured in position. In addition, the bridge 16 is formed with four rectangular apertures 18, each permitting access to any external connectors provided on an expansion card.

FIG. 3 shows the mounting of two expansion cards 10 on the mounting bridge 16 of the FIG. 2 structure 15. The expansion cards are first plugged by their connector portions into internal electrical connectors mounted on a circuit board extending out at right angles from the housing wall (neither this circuit board nor the connectors are shown as the present invention is not concerned with these elements). At the same time, the locating tab 13 of each card is inserted in a corresponding slot formed in the housing structure (again, this slot is not shown as it is not relevant to the invention). The mounting plate 12 of each card lies against the mounting bridge with the recess 14 of each mounting plate aligned with a corresponding one of the threaded apertures 18 in the mounting bridge 16. A fixing screw 19 is then used to secure each card in position, the screw being engaged in the corresponding aperture 18 and screwed down to clamp the mounting plate of the card against the bridge 16. This clamping also serves to provide a good grounding (earthing) connection between the plate 12 and the mounting bridge 16.

Blanking plates 20 of a form similar to the mounting plates 12 are fixed in position by further screws 19 over the apertures 17 of the bridge 16 for which there are no corresponding expansion cards.

This prior art arrangement for securing expansion cards in position is somewhat cumbersome for unskilled users who may drop the fixing screws inside the computer or may find it difficult to screw in the screws 19 (the close presence of the housing hindering turning of the screws by hand). The need to have multiple fixing screws where multiple expansion card slots are present is also inconvenient.

FIG. 4 shows one known arrangement for overcoming some of the problems presented by the traditional way of securing expansion cards in position. In the FIG. 4 arrangement, a clamping bar 40 provided with clamping fingers 41 is used to secure in position a plurality of expansion cards/blanking plates (for reasons of clarity, only one card 10 is illustrated). More particularly, the fingers 41 serve to clamp the card mounting plates 12/blanking plates against a bridge structure 16 of the housing 15. At each end of the clamping bar 40 is a side pillar 42 that supports the bar on the top of the bridge structure 16. Each pillar 42 has a depending spigot 43 that is located in an aperture 44 in the bridge structure 16. The spigots 43 serve to position the bar and to define an axis A about which the bar can be pivoted in a direction indicated by arrow B to move the bar 40 from an inclined position (in which it resides when the spigots are first introduced into the apertures 44) to an upright position shown in FIG. 4. In the latter position, a snap-engagement member 45 provided on top of the bar 40, snap engages in an aperture 46 formed in the housing 15. In use, once the card 10 has been placed in position, the spigots of the clamping bar 40 are inserted into the apertures 44 and the bar is then pivoted into its upright position to move a corresponding one of the fingers into clamping engagement with the mounting plate 12 of card. When upright, the bar 40 snap engages into position. The bar 40 is made of a plastics material and in order to facilitate electrical grounding of the mounting plate 12, a thin metal grounding finger can be provided beneath each finger 41, these grounding fingers being electrically connected to a contact that is pressed against the housing when the bar is in its snap-engaged position.

Although the FIG. 4 arrangement facilitates the secural of multiple cards and avoids the risk of fixing screws being lost inside the housing, a number of drawbacks still exist. Thus, the need to provide side pillars to support pivoting movement of the bar means that the extent of the mounting bridge is greater than otherwise needed—this makes the arrangement unsuitable for use where space is at a premium (for example, it would be difficult to use the arrangement in the FIG. 2 situation). Furthermore, the magnitude of clamping pressures obtainable using the FIG. 4 arrangement is generally not as great as can be achieved with a screw mechanism which also has the benefit of adjustability. Finally, the need to provide a complex plastics part (the bar 40) and a separate metal grounding part, increases the cost of the securing arrangement.

It is an object of the present invention to provide an arrangement for securing an expansion card (or other user-installable unit) that overcomes at least some of the disadvantages of the prior art.

SUMMARY OF THE INVENTION

According to the present invention, there is provided an arrangement for securing a user-installable unit inside a computer housing, the arrangement comprising:

a clamping lever passing through an aperture in the housing to provide an external arm connecting to an internal finger, the clamping lever being pivotal on the housing; and screw-threaded means having first and second members in screw-threaded engagement with each other, the first and second members being in force-transmitting relation respectively with the housing and with the clamping-lever arm, and one said member being externally accessible for user operation to pivot the clamping lever on the housing whereby to clamp a part of the user-installable unit between the clamping-lever finger and the housing.

With this arrangement, the screw-threaded fixing means is provided outside the housing and is therefore easier to operate and avoids the risk of fixing screws being dropped inside the computer. Furthermore, it is possible to limit the sideways extent of the clamping lever to that of the user-installable unit.

The user-installable unit is, for example, a plug-in expansion card, a disc drive unit or other functional unit; however, the term "user-installable unit" is also to be construed to cover a blanking plate for closing an access aperture in the computer housing.

Advantageously, the clamping lever has a plurality of internal fingers connecting to said external arm, these fingers serving to secure a plurality of user-installable units by clamping them against the housing. Preferably, the fingers extend out of the housing through respective apertures therein to connect with the clamping-lever arm externally of the housing, the portions of the housing between these apertures preventing the clamping lever from passing fully into the housing and potentially causing damage.

Preferably, the clamping lever is formed as a crank-shaped member that is pivotal on the computer housing adjacent said aperture to form a first class lever. As regards the screw-threaded means, this is preferably formed by a threaded aperture in the housing and a threaded bolt engaged in the threaded aperture and bearing against the free end of the clamping lever arm.

BRIEF DESCRIPTION OF THE DRAWINGS

A securing arrangement embodying the invention will now be described, by way of non-limiting example, with reference to the accompanying diagrammatic drawings, in which.

BEST MODE OF CARRYING OUT THE INVENTION

Figure 1:
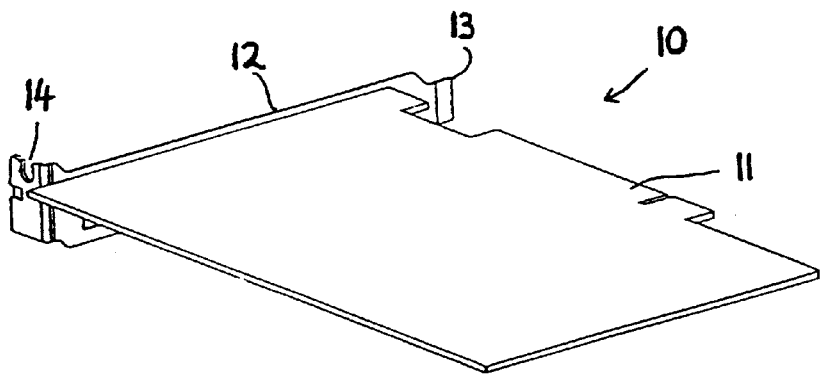
FIG. 1 is a perspective view of a known plug-in expansion card for a computer.
Figure 2:
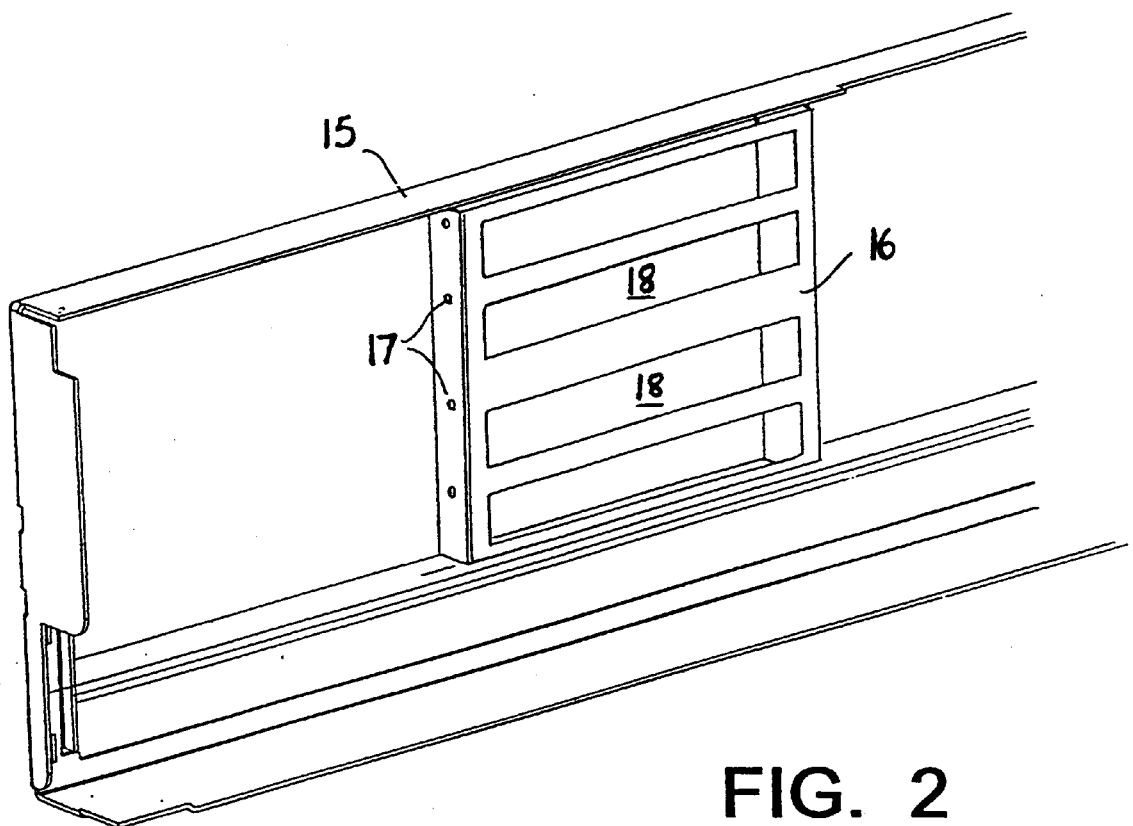
FIG. 2 is a perspective view of the inside of a part of a computer housing showing a known structure for mounting expansion cards.
Figure 3:
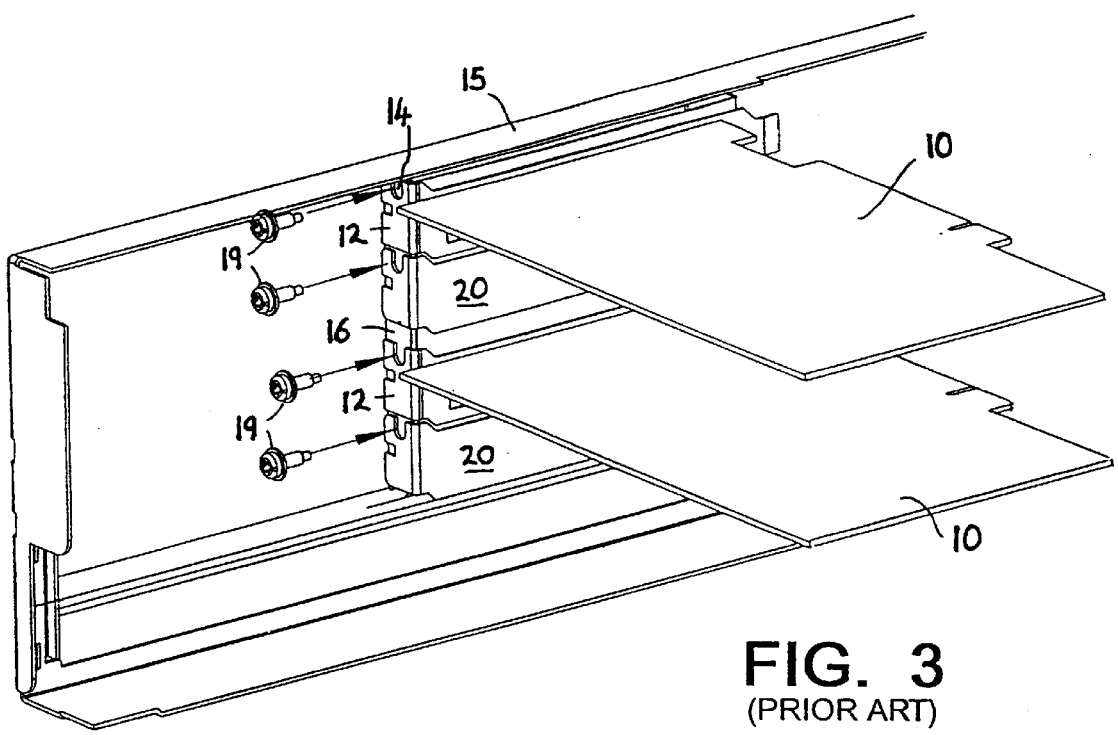
FIG. 3 is a perspective view similar to FIG. 2 but showing two expansion cards of the FIG. 1 form in a mounted position.

FIGS. 5 to 8 illustrate, on an enlarge scale as compared to FIGS. 1 to 3, an embodiment of the invention for securing expansion cards within a computer housing. According to this embodiment, the fixing screws 19 (see FIG. 3) are replaced by a clamping lever 22 which is fixed in position by a single, externally-accessible, screw member 25.

Figure 6:
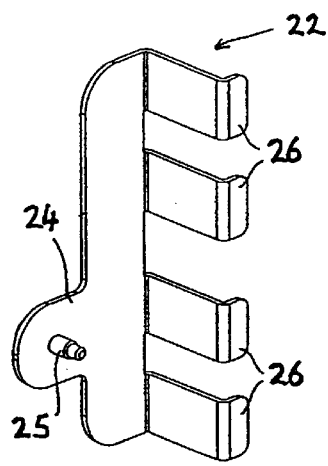
FIG. 6 is a perspective view of the other side of the FIG. 5 lever.
Figure 4:
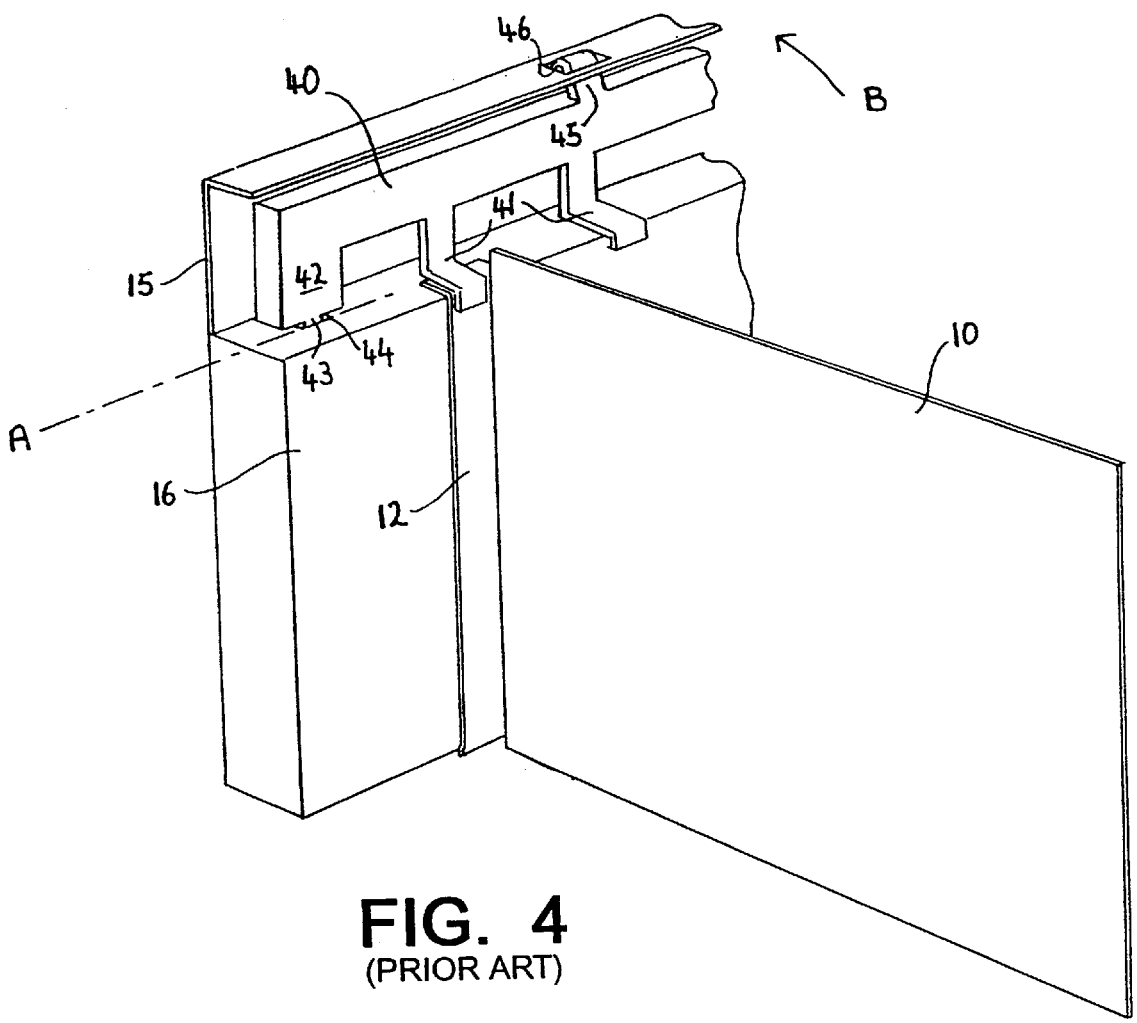
FIG. 4 is a perspective view of the inside of a part of a computer housing showing another known arrangement for mounting expansion cards.
Figure 5:
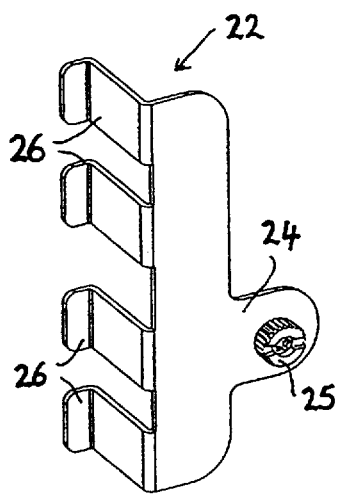
FIG. 5 is a perspective view of one side of a clamping lever of an embodiment of the invention.
Figure 7:
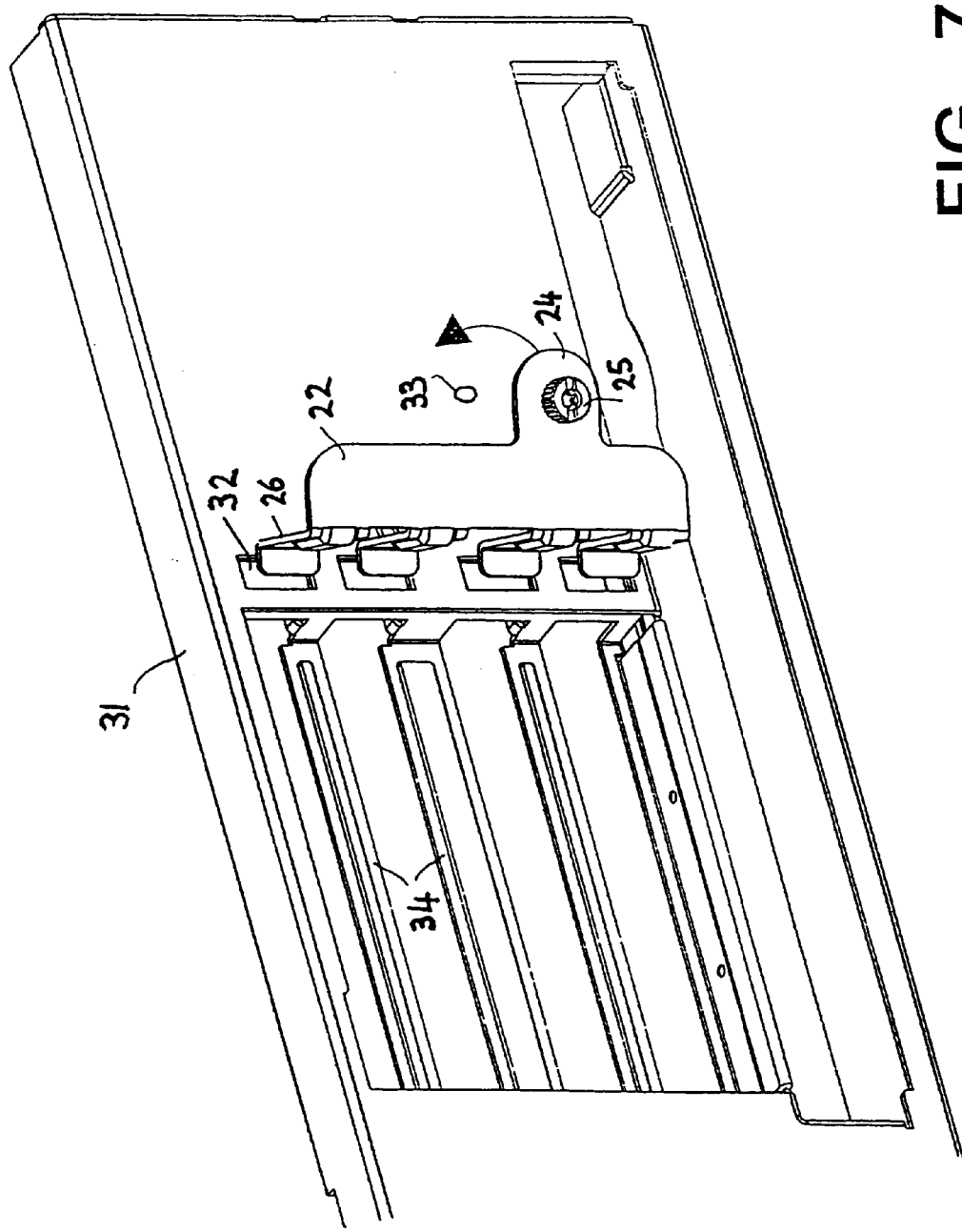
FIG. 7 is a perspective view of the outside of part of a computer housing adapted to receive the clamping lever of FIGS. 5 and 6.

More particularly, and with reference to FIGS. 5 and 6, the clamping lever 22 comprises a crank-shaped metal member formed with an arm 24 that expands out into four fingers 26. The fingers 26 have bent-over end portions. An externally-threaded member 25 is held captive in the free end of the arm 24 and is provided with a knurled head.

Figure 8:
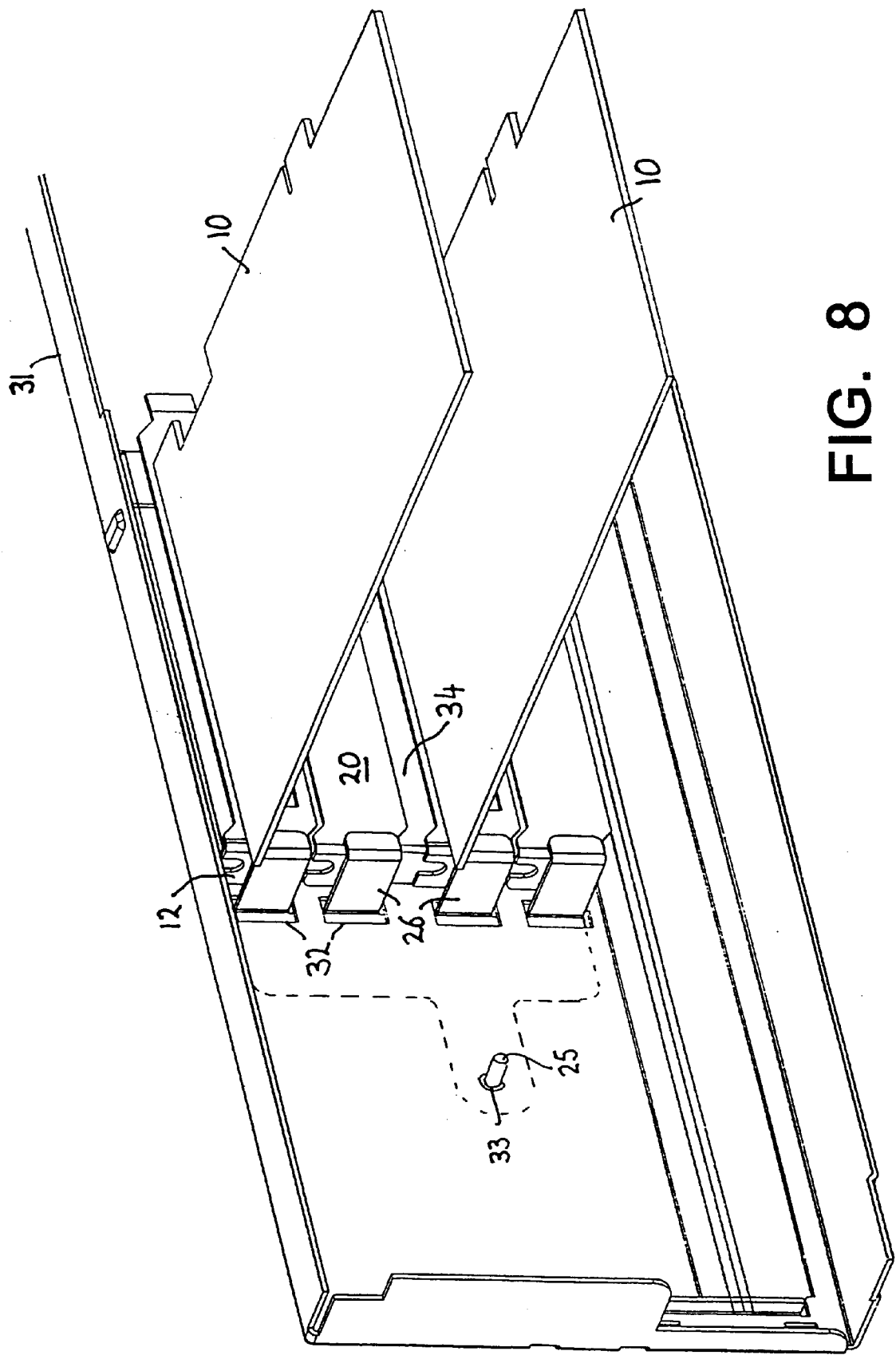
FIG. 8 is a perspective view similar to FIG. 3 but illustrating the operation of the clamping lever of FIGS. 5 and 6 for clamping two expansion cards of the FIG. 1 form on a housing of the FIG. 7 form.

The fingers 26 of the clamping lever 22 are intended for insertion through respective apertures 32 formed in a computer housing 31 (see FIG. 7) adjacent an expansion-card bridge 34 similar to the mounting bridge 16 of FIGS. 2 and 3. With the fingers 26 inserted in the apertures 32, the threaded member 25 can screw-threadedly engage in a threaded aperture 33 formed in the housing 31. The head of the threaded member 25 and the arm 22 lie outside the housing 31 enabling a user ready access to the head of the threaded member 25. As a user tightens up the threaded member 25 to approach the free end of the arm 24 towards the housing 31, the clamping lever 22 executes a pivoting action on the housing about an axis lying generally along the line of the edges of the apertures 32 nearest the aperture 33. This pivoting action moves the end portions of the fingers 26 towards the mounting bridge 34. As a result, the fingers 26 can be used to clamp expansion cards 10 or blanking plates 20 in position on the mounting bridge 34 as is illustrated in FIG. 8. The bent-over end portions of the fingers 26 serve to trap the mounting plates 12 of the cards 10 and/or the blanking plates 20 against the bridge 34 of the housing 31.

This arrangement thus enables a single clamping lever to be used to secure in position four user-installable units (in FIG. 8 the four units are constituted by two expansion cards and two blanking plates). The clamping lever itself is fixed by a single screw 25 that is readily accessible to the user. There is a little risk of either the fixing screw 25 or the clamping lever 22 falling into the interior of the housing, the lever 22 being prevented from entering fully into the housing by the portions of the housing located between the apertures 32.

It will be appreciated that many variants are possible to the illustrated embodiment. For example, the number of clamping fingers 26 can be varied and, indeed, the clamping lever may only have one such finger where there is only one user-installable unit to secure in position. Furthermore, the user-installable unit is not restricted to being an expansion card and may, for example, be a disc drive unit which it is wished to secure in position up against the computer housing.

As the clamping lever 22 is formed of metal, it is facilitates earthing of the mounting plates 12 and/or of the blanking plates 20 on the computer housing 31.

The screw-threaded arrangement may be varied from that illustrated provided that a first one of the threaded members remains in force-transmitting relation with the housing 31 and a second one of the threaded members remains in force-transmitting relation with the arm 24 of the clamping lever, and provided also that one of these threaded members remains externally accessible for user operation. Thus one possible alternative arrangement would be to provide the housing 31 with an externally-projecting threaded stud that passes through an aperture in the arm 24, this stud then being engaged by a knurled nut bearing against the arm 24. In the illustrated embodiment of the invention the clamping lever 22 forms a first class lever, that is, one in which its fulcrum is positioned between the load (here, the clamping end portions of the fingers 26) and the point of force application (the point at which the head of the threaded member 25 contacts the arm 24). By appropriate design, it would be possible to change the class of the clamping lever.

I claim:

1. An arrangement for securing a user-installable unit inside a computer housing, the arrangement comprising:

a clamping lever passing through an aperture in the housing to provide an external arm connecting to an internal finger, the clamping lever being pivotal on an edge of the housing, said edge serving as a fulcrum for said clamping lever, said finger disposed on a side of said clamping lever that abuts said edge; and first and second screw-threaded members in screw-threaded engagement with each other, said first and second screw threaded members being in force-transmitting relation respectively with said housing and with said arm, and one said member being externally accessible for user operation to pivot the clamping lever on the edge of the housing whereby to clamp a part of said user-installable unit between said finger and the housing.

2. An arrangement according to claim 1, wherein said clamping lever has a plurality of internal fingers connecting to said external arm and serves to secure a plurality of user-installable units by clamping them against the housing.

3. An arrangement according to claim 2, wherein said fingers extend out of said housing through respective apertures therein to connect with said arm externally of the housing, the portions of the housing between said apertures preventing the clamping lever from passing fully into the housing.

4. An arrangement according to claim 1, wherein said clamping lever is made of metal and forms part of an electrical earthing system for said user-installable unit.

5. An arrangement according to claim 1, wherein said clamping lever is removable through said aperture without internal intervention in the housing.

6. An arrangement according to claim 1, wherein said clamping lever is pivotal on said housing adjacent said aperture whereby said clamping lever forms a first class lever.

7. An arrangement according to claim 1, wherein the said first member of the screw-threaded means is formed by a threaded opening in the housing and said second member is a threaded bolt extending through said arm and engaging in said threaded opening.

8. An arrangement according to claim 1, wherein the said first member of the screw-threaded means is formed by an outwardly projecting threaded stud fast with said housing and said second member is a threaded nut engaging said threaded stud.

9. An arrangement according to claim 1, wherein said user-installable unit is an expansion card.

10. An arrangement according to claim 1, wherein said user-installable unit is a disc drive unit.

* * * * *